(12) United States Patent
Young et al.

(10) Patent No.: US 7,058,919 B1
(45) Date of Patent: Jun. 6, 2006

(54) METHODS OF GENERATING TEST DESIGNS FOR TESTING SPECIFIC ROUTING RESOURCES IN PROGRAMMABLE LOGIC DEVICES

(75) Inventors: Jay T. Young, Louisville, CO (US); Sridhar Krishnamurthy, San Jose, CA (US); Jeffrey V. Lindholm, Longmont, CO (US); Ian L. McEwen, Golden, CO (US)

(73) Assignee: Xilinx, Inc., San Jose, CA (US)

( * ) Notice: Subject to any disclaimer, the term of this patent is extended or adjusted under 35 U.S.C. 154(b) by 267 days.

(21) Appl. No.: 10/696,357

(22) Filed: Oct. 28, 2003

(51) Int. Cl.
*G06F 17/50* (2006.01)

(52) U.S. Cl. .............................. 716/12; 716/13; 716/14; 716/16; 716/17

(58) Field of Classification Search .................. 716/12, 716/16, 17, 13, 14
See application file for complete search history.

(56) References Cited

U.S. PATENT DOCUMENTS

| | | | | |
|---|---|---|---|---|
| 5,867,507 A | * | 2/1999 | Beebe et al. | 714/726 |
| 6,130,554 A | * | 10/2000 | Kolze et al. | 326/41 |
| 6,851,101 B1 | * | 2/2005 | Kong et al. | 716/12 |

* cited by examiner

*Primary Examiner*—Sun James Lin
(74) *Attorney, Agent, or Firm*—Lois D. Cartier; LeRoy D. Maunu (57) ABSTRACT

Methods of directly targeting specified routing resources in a PLD, e.g., routing resources that need to be tested. Test designs are produced that implement observable nets using the targeted routing resources. A PLD router is used to route from a target routing resource backwards through the routing fabric of the PLD to the source of an observable net. The net is identified based on the source, and loads of the net are identified as router load targets. The router is then used to route from the target routing resource forwards to one of the loads on the net. This process can be repeated for a list of target routing resources to provide a test design that tests as many of the targeted routing resources as possible. Additional test designs can be created to test remaining target routing resources. In other embodiments, the router routes first forwards, then backwards.

33 Claims, 7 Drawing Sheets

METHODS OF GENERATING TEST DESIGNS FOR TESTING SPECIFIC ROUTING RESOURCES IN PROGRAMMABLE LOGIC DEVICES

FIELD OF THE INVENTION

The invention relates to Programmable Logic Devices (PLDs). More particularly, the invention relates to methods of generating test designs for testing specific routing resources in PLDs.

BACKGROUND OF THE INVENTION

Figure 1:
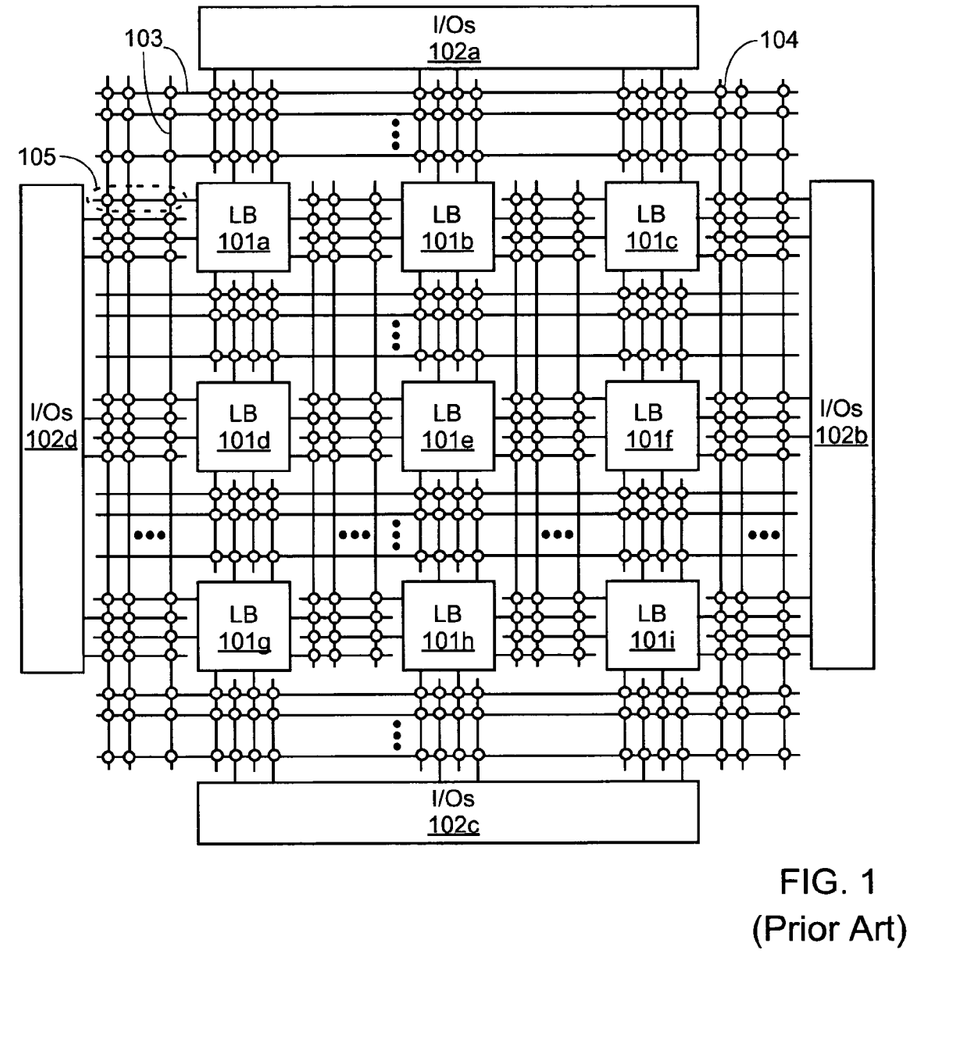
FIG. 1 is an architectural representation of a field programmable gate array (FPGA) type of PLD.

Programmable logic devices (PLDs) are a well-known type of integrated circuit that can be programmed to perform specified logic functions. FIG. 1 is a simplified illustration of one type of PLD, the Field Programmable Gate Array (FPGA). An FPGA typically includes an array of configurable logic blocks (LBs 101a–101i) and programmable input/output blocks (I/Os 102a–102d). The LBs and I/O blocks are interconnected by a programmable interconnection array that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

The interconnection array, LBs, I/O blocks, and other logic blocks are typically programmed by loading a stream of configuration data into internal configuration memory cells that define how the interconnection array and logic blocks are configured. The configuration data can be read from memory (e.g., from an external PROM) or written into the FPGA by an external device. The collective states of the individual memory cells then determine the function of the FPGA.

Figure 2:
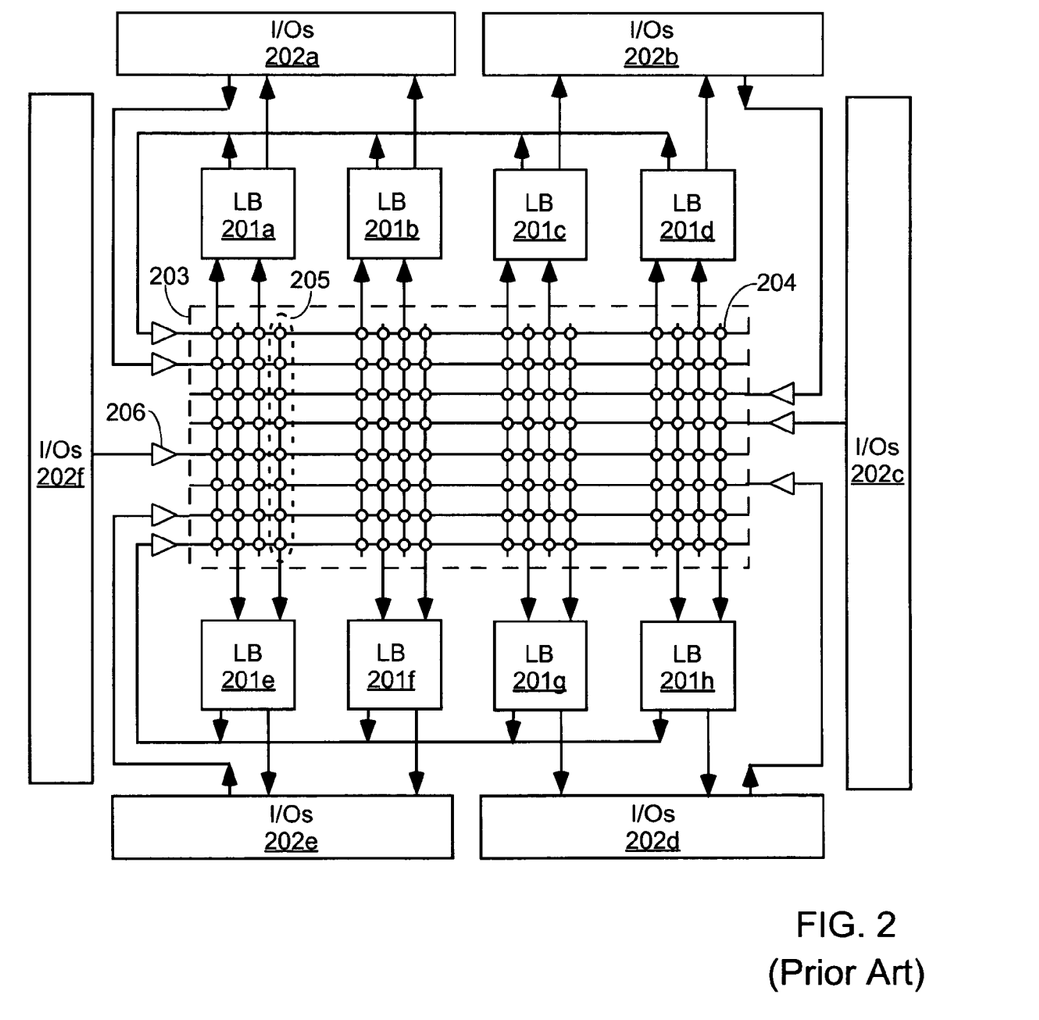
FIG. 2 is an architectural representation of a complex programmable logic device (CPLD) type of PLD.

FIG. 2 is a simplified illustration of another type of PLD called the Complex Programmable Logic Device, or CPLD. A CPLD includes two or more logic blocks (LBs 201a–201h) connected together and to input/output blocks (I/Os 202a–202f) by a programmable interconnection array (203). Each logic block of the CPLD includes a two-level AND/OR structure similar to those used in Programmable Logic Arrays (PLAs) and Programmable Array Logic (PAL) devices. The interconnection array includes many multiplexer circuits 205, each including several PIPs 204. In each multiplexer circuit 205, only one PIP 204 is enabled. The enabled PIP selects one of the many input signals provided to the interconnection array, and the selected input signal is provided as the output signal from the multiplexer circuit 205.

In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Testing a large PLD can be a time-consuming process. A user design can utilize any of what can be millions of programmable elements on the PLD. Therefore, preferably every element on each PLD is thoroughly tested, including every programmable logic element and every interconnect line. This goal can be difficult to achieve using known technology, particularly the testing of all routing resources (e.g., interconnect lines, PIPs, routing multiplexers, and so forth) in a PLD.

Known routing software is designed to route nets between net terminals, typically from a known source terminal to a known load terminal. Known routing software is not designed to route through specific routing resources. Therefore, targeting a specific routing resource to be included in a test design can be very difficult.

According to known methods, to test routing resources in a PLD a set of test designs is created that collectively utilize all of the routing resources in the PLD (or as close to all as can reasonably be accomplished). The routing resources are included in the test designs in such a manner that if any routing resource in the PLD does not work correctly, then one of the test designs will fail to function properly and a testing failure will be reported.

Historically, a modified general product router has been used to test as many routing resources as possible in each design. To accomplish this goal, information is maintained in a database as to whether or not a routing resource has already been tested, and the router uses this information to help its expansion algorithm find untested routing resources. Most routers use general wave front expansion, which routes a single net or source/load pair at a time, and generally from the source to the load of the net. Resource costs are used to help guide the router in the right direction via the expansion algorithm used by the router. When previously untested resources are included in the design, a bonus is given for using these resources. When previously tested resources are included, a penalty is assessed.

However, this known method has its drawbacks. In particular, the process tends to build up penalty walls between net sources and untested resources, because everything close to the source is tested quickly. Enhancements have been made to the process in an attempt to overcome this drawback. One such enhancement is to reduce the cost of a routing path's resources when an untested resource is found late in the process after penalty walls have been built. The rationale behind this approach is that if an untested resource is found late in the process, then there may be other untested resources in the same area. By reducing the cost of routing to the area, the probability of picking up more untested resources is increased.

When these known methods are used, untested routing resources are picked up quickly in the early stages of the routing process. However, the number of untested resources picked up by future passes drops off dramatically. In addition, the last few untested resources are frequently never picked up at all, because the expansion algorithm never locates them. These resources are often referred to as "hard to test" resources. To include these hard to test resources in test designs, test engineers frequently have to route them manually. This process can be difficult and time consuming.

Therefore, it is desirable to provide more efficient methods of generating test designs for PLDs that utilize particular routing resources targeted for testing.

SUMMARY OF THE INVENTION

The invention provides methods of directly targeting specified routing resources in a PLD, e.g., routing resources that need to be tested. Test designs are produced that implement observable nets using the targeted routing resources. To accomplish this goal, a PLD router is used to route from a target routing resource backwards through the routing fabric of the PLD to the source of an observable net. The net is identified based on the source, and loads of the net are identified as router load targets. The router is then used to route from the target routing resource forwards to one of the loads on the net. This process can be repeated for a list of target routing resources to provide a test design that tests as many of the target routing resources as possible. Additional test designs can be created to test remaining target routing resources not included in previously-created designs. In other embodiments, the router routes first forwards, then backwards.

According to one aspect of the present invention, a method of generating a test design for a PLD includes loading an unrouted design; identifying nets in the unrouted design that can be used to test target routing resources in the PLD and setting sources of the identified nets as router source targets; processing each target routing resource; and routing a remainder of the unrouted design to create the test design. Processing each target routing resource includes setting the target routing resource as a router starting point, routing backwards from the target routing resource to one of the router source targets, identifying a net by the source routed to and setting a load of the net as a router load target, routing forwards from the target routing resource to the router load target, and marking the routing resources used by the net as tested.

According to another aspect of the invention, the router first routes forwards from the target routing resource to a load, identifies the net associated with the load, then routes backwards from the target routing resource to the source associated with the load. In one such embodiment, a method of generating a test design for a PLD includes loading an unrouted design; identifying nets in the unrouted design that can be used to test target routing resources in the PLD and setting loads of the identified nets as router load targets; processing each target routing resource; and routing a remainder of the unrouted design to create the test design. Processing each target routing resource includes setting the target routing resource as a router starting point, routing forwards from the target routing resource to one of the router load targets, identifying a net by the load routed to and setting a source of the net as a router source target, routing the net between the target routing resource and the router source target, and marking the routing resources used by the net as tested.

Additional aspects of the invention include computer-readable storage media and computer systems utilizing the processes described herein.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The present invention has been found to be particularly applicable and beneficial for field programmable gate arrays (FPGAs). However, the present invention is not so limited. Further, numerous specific details are set forth herein to provide a more thorough understanding of the present invention. It will be apparent to one skilled in the art that the present invention can be practiced without these specific details.

As previously described, a known method of generating test designs for PLD routing resources includes starting with a list of nets from an unrouted design, and implementing the nets while preferentially targeting previously unused routing resources. In contrast, an embodiment of the invention utilizes another approach, that of starting from a target routing resource, then routing backwards from the target routing resource to a source and forwards from the target routing resource to a load. Thus, routing resources not yet included in a test design are directly addressed by the router. Directly addressing the untested routing resources generally eliminates the previously-described phenomenon of "hard to test" routing resources.

Figure 3:
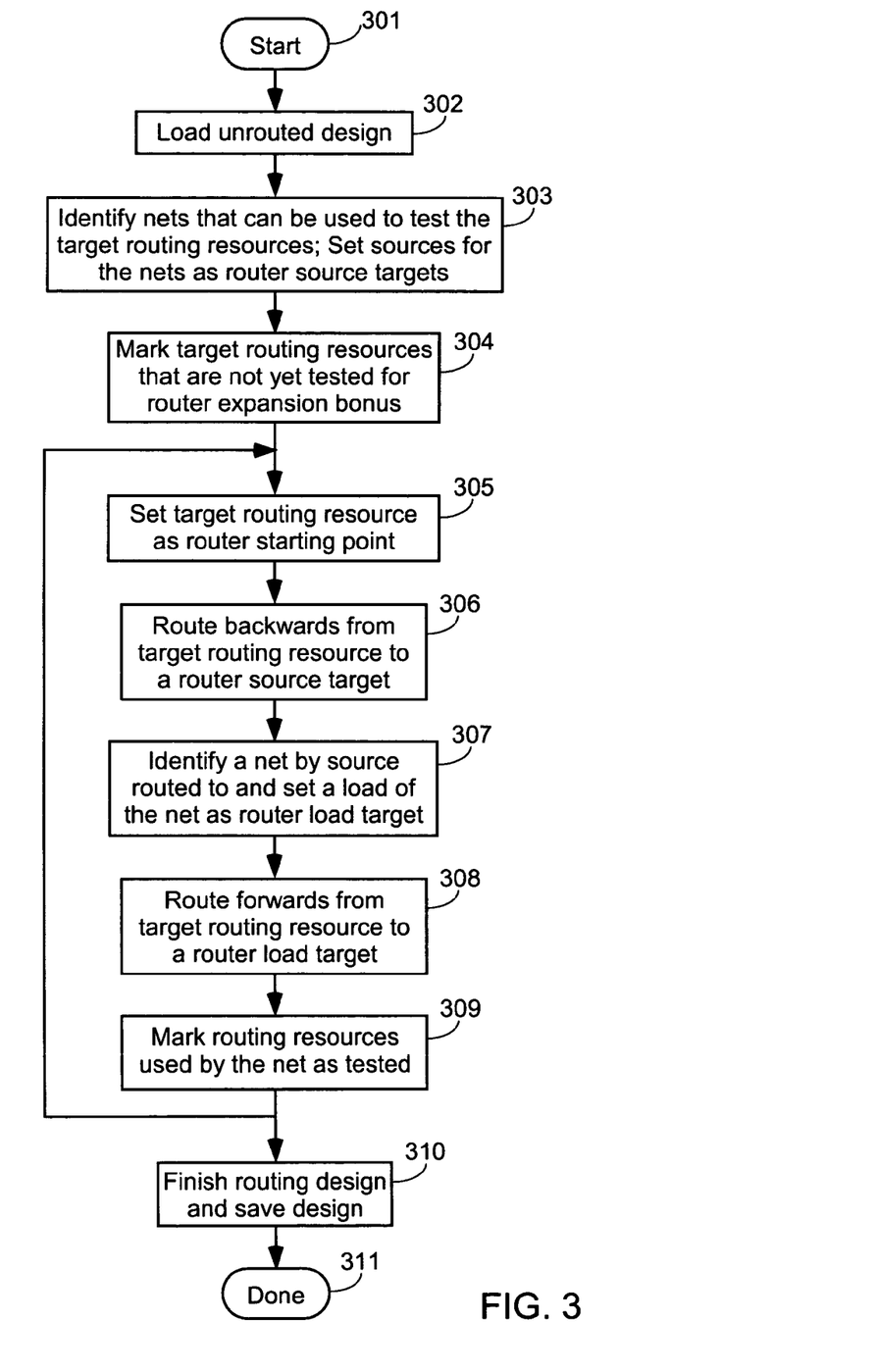
FIG. 3 illustrates the steps of a first method of generating a test design for a PLD, according to an embodiment of the present invention.

FIG. 3 illustrates the steps of one method of generating test designs for a PLD, according to an embodiment of the invention. The term "generating a test design" is used in this context to mean starting with an existing but unrouted or partially routed design, and adding routing information to the design to provide a fully routed design that can be used for testing purposes. Start step 301 provides a starting point for the process. In step 302, an unrouted design is loaded (e.g., provided to or accessed by the router software). The unrouted design is a description of the test design that includes implementations and placements of the programmable logic portions of the design, but in which the nets interconnecting the logic portions are not yet connected via the routing resources of the PLD.

In step 303, the nets in the unrouted design that can be used to test the target routing resources are identified. The identified nets can include all nets in the unrouted design that are observable by the tester. For example, the identified nets can include all nets in which a flaw (e.g., a manufacturing defect) will cause the tester to report a testing failure when a "marching one" test is applied to a test input port. These nets can include, for example, nets in the data flow of test data through the design, while omitting clock nets, reset nets, and nets that carry control signals for the design. Also in step 303, the sources of the identified nets are set as source targets for the router ("router source targets").

In optional step 304, target routing resources in the PLD (e.g., routing resources to be tested that are not yet included in a test design) are marked to receive a router expansion bonus. These resources will receive preferential treatment by the router. When routing backwards and forwards from the target routing resource, the router will attempt to use these marked resources rather than other routing resources that are already included in other test designs. This bonus should be used carefully, as applying too large a bonus can create unroutable designs. An undesirably large bonus can also cause nets to be routed inefficiently, i.e., using large numbers of routing resources. This can cause the delay of the net to exceed a maximum allowable delay. An appropriate magnitude for the bonus can be determined for each router and PLD by straightforward experimentation.

In step 305, one of the target routing resources is set as the starting point for the router. Note that some routing resources in a PLD can be considered to be "locked" by a net. Locked routing resources are routing resources that can only be used by one specific net in the test design. Therefore, the router has no choice as to which net is routed through a locked resource. In some embodiments, the nets associated with the locked resources are routed separately, and steps 305–308 are not applied to these resources.

In step 306, the router routes backwards from the target routing resource to one of the router source targets set in step 303. The choice of a router source target determines which net in the design is routed through the target routing resource. The selection of a net from the design to test each target routing resource is made dynamically as part of the routing process. When more than one net is available, the net used to test a target routing resource should not be predetermined, because the source and load of some of the nets might be too far away to generate a route within requested delay limits.

In step 307, the net associated with the router source target of step 306 is identified, and one or more loads of the net are set as load targets for the router ("router load targets"). In step 308, the router routes forward from the target routing resource to one of the router load targets identified in step 307.

Steps 306–308 can occur sequentially, as shown in FIG. 3, or interactively one with another. For example, in one interactive embodiment, the dynamic selection of a net includes identifying all nets that could be used to test the target routing resource, considering the sources of all of these nets as targets for the router, and allowing the router to route backwards to each of the sources. If none of the routes succeeds then the target routing resource cannot be tested in this test design. If one of the routes succeeds then the net is identified and the router can attempt to route forwards from the target routing resource to the loads of the net.

In step 309, the routing resources used by the net are marked as tested, including the target routing resource. All other routing resources used by the net are also preferably marked as tested. Thus, the method of FIG. 3 will not be unnecessarily applied to these routing resources. Additionally, the used routing resources will no longer be given preferential treatment by the router in later-generated test designs for the PLD. In some embodiments, a list of the targeted routing resources is maintained, and the used routing resources are marked in the list.

At this point, the router is ready to route another of the nets in the design, targeting another of the target routing resources. Thus, steps 305–309 are repeated, in one embodiment until each of the target routing resources has either been successfully routed or has failed to route.

In step 310, any nets left in the design that remain unrouted are routed using any available routing resources, and the design is saved. The method terminates at Done step 311.

Figure 4:
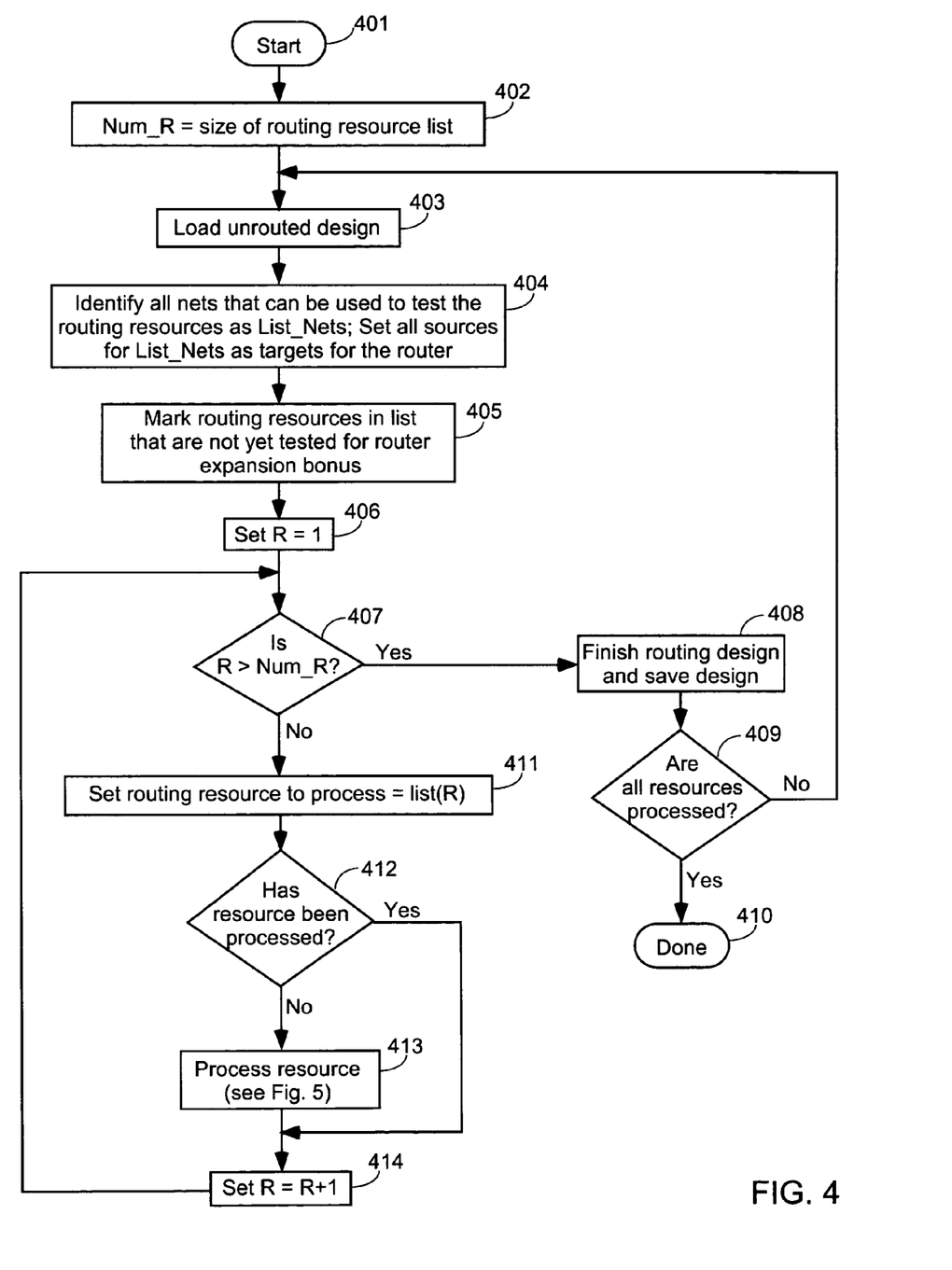
FIG. 4 illustrates the steps of a second method of generating a test design for a PLD, according to an embodiment of the present invention.
Figure 5:
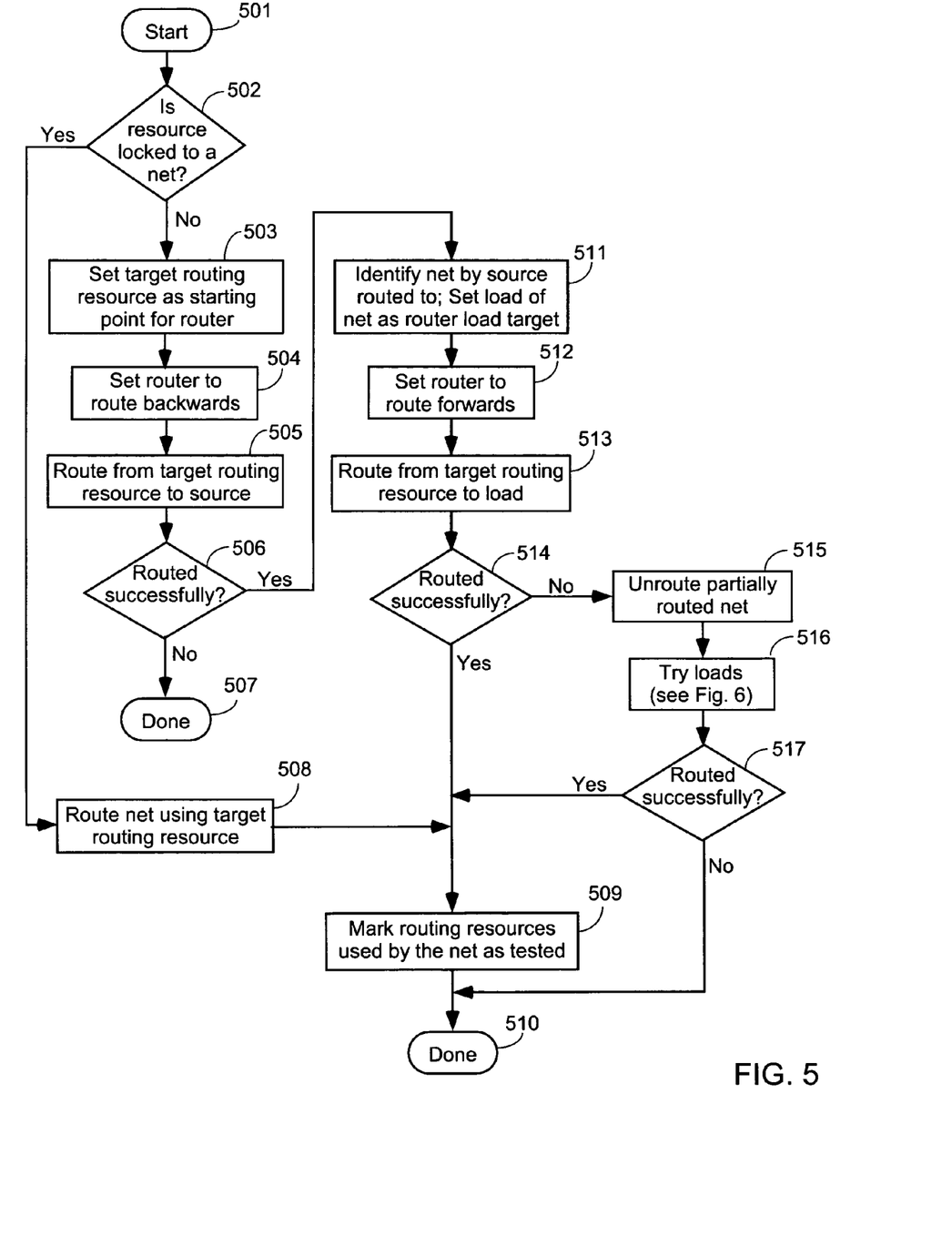
FIG. 5 illustrates one method of processing a target routing resource, e.g., when the method of FIG. 4 is applied.
Figure 6:
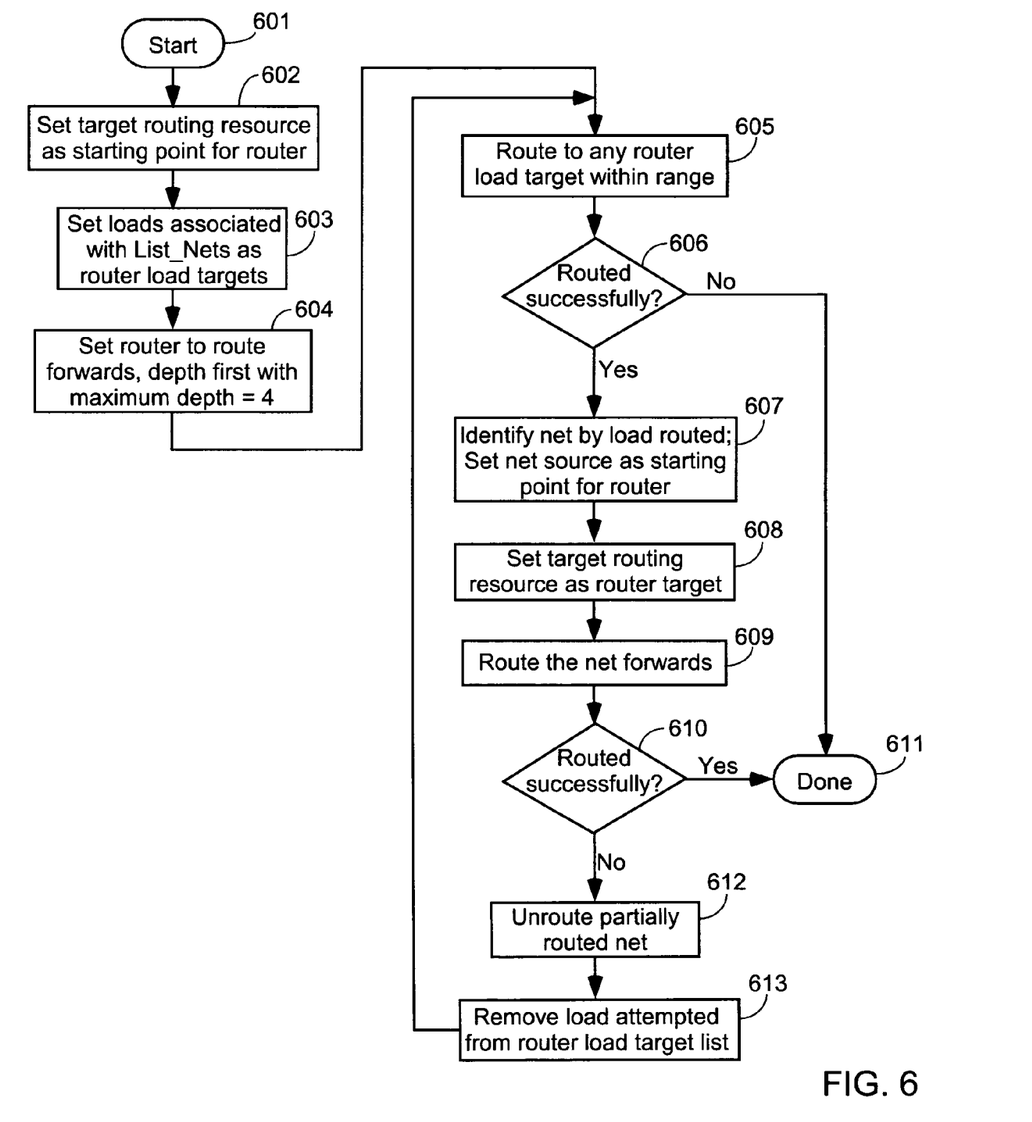
FIG. 6 illustrates one method of routing forwards from a target routing resource to a series of loads on a net, e.g., when the method of FIG. 5 is applied.

In the method of FIG. 3, the router routes from the target routing resource first to sources, then to loads. For some target routing resources, the route from the target routing resource to the load will not be successful, because the loads that the target routing resource can drive are limited. For example, some FPGAs include CLB input multiplexers (the target routing resources) that can drive several loads, but all are located in a limited physical area (e.g., all in the same CLB). However, each CLB input multiplexer can potentially be driven by a relatively large number of different sources. This type of resource is more likely to be picked up by a route that first routes from the target routing resource to the load, then from the target routing resource to the source. Therefore, in some embodiments, if the "first source, then load" route is unsuccessful, a "first load, then source" route is attempted. FIGS. 4–6 illustrate one such embodiment.

FIG. 4 illustrates the steps of a second method of creating test designs for routing resources in a PLD. Start step 401 provides a starting point for the process. In step 402, the variable Num_R is set to the size of a routing resource list for the PLD. The routing resource list is a list of target routing resources for the PLD. In step 403, an unrouted design is loaded.

In step 404, the nets in the unrouted design that can be used to test the target routing resources are identified and placed in a list called List_Nets. Also in step 404, all sources for the nets in List_Nets are set as targets for the router. In optional step 405, the target routing resources in the routing resource list that are not yet tested are marked to receive a router expansion bonus.

In step 406, a variable R is set to "1" (one). In decision step 407, the value of variable R is compared to Num_R, the size of the routing resource list. If R exceeds Num_R, the route is complete for all target routing resources, and the method continues at step 408. In step 408, any nets left in the design that remain unrouted are routed using any available routing resources, and the design is saved. If all target routing resources have been processed (decision step 409), the method terminates at Done step 410. If not, another unrouted design is loaded, and the method continues at step 403.

In step 407, if R does not exceed Num_R, at least one target routing resource remains on the routing resource list, and the method continues at step 411. In step 411, the "routing resource to process" is set to list(R), i.e., the next target routing resource on the list. If the resource has not already been processed (decision step 412), the resource is processed (step 413). Details of the resource processing for one embodiment are shown in FIG. 5. If the resource was already processed (decision step 412), the method proceeds directly to step 414, where the variable R is incremented to point to the next target routing resource on the routing resource list.

FIG. 5 shows how each target routing resource is processed in step 413 of FIG. 4, according to one embodiment. Start step 501 provides a starting point for the method of FIG. 5.

In decision step 502, if the target routing resource is locked to just one net (i.e., is a "locked resource"), the net is routed using the target routing resource (step 508), and the method continues at step 509. If the target routing resource is not a locked resource (step 502), the target routing resource is set as a starting point for the router (step 503).

The router is then set to route backwards (step 504) and routes from the target routing resource backwards to one of the sources set as router targets in step 404 (see FIG. 4).

In decision step 506, if the route is not successful (e.g., the router cannot route from the target routing resource to any of the available sources), the resource processing is complete, and the flow returns to FIG. 4 via Done step 507. If the route is successful (e.g., the router successfully routes from the target routing resource to one of the available sources), the net associated with the source routed to is identified and the load of the net is set as the router load target (step 511).

In step 512, the router is set to route forwards, and in step 513 the router routes the net from the target routing resource to the load. If the route is successful, the method continues at step 509, where the routing resources used by the routed net are marked as tested (e.g., in the routing resource list), and the method is complete (Done step 510). If the route is not successful (step 514), the partially routed net is unrouted (step 515), and the router attempts to reroute the net using other loads of the net ("try loads" step 516). Details of the "try loads" process for one embodiment are shown in FIG. 6.

If the router successfully routes the net using one of the other loads (decision step 517), the method continues at step 509. If the router is not successful in routing the net (step 517), the method terminates (Done step 510).

FIG. 6 shows how the router attempts to route the net using additional loads in step 516 of FIG. 5, according to one embodiment. Start step 601 provides a starting point for the method of FIG. 6. In step 602, the target routing resource is set as the starting point for the router. In step 603, the loads associated with the nets in List_Nets (see step 404 of FIG. 4) are set as router load targets. In step 604, the router is set to route forwards. In the pictured embodiment, the router is also set to perform a depth first route with a maximum depth of four routing resources. In other words, only loads within four routing resources of the target routing resource will be routed to. Depth first routes are well known to those of skill in the PLD routing arts. In step 605, the router attempts to route to any router load target within the specified range.

If the attempt to route from the target routing resource to a load is not successful (decision step 606), the target routing resource cannot be used in the present test design, and the method terminates (Done step 611). If the attempt is successful (step 606), the net associated with the successful load is identified and the source for the net is set as the starting point for the router (step 607). The target routing resource is set as the router target (step 608), and the router attempts to route forward from the source to the target routing resource. If the attempt is successful (decision step 610), the net is routed and the method terminates (Done step 611). If the attempt is not successful (step 610), the partially routed net is unrouted (step 612), and the load just attempted is removed from the router load target list. The method continues at step 605, and the router attempts to route the net using another load.

Note that in the embodiment of FIG. 6, the router routes forward from the source to the target routing resource. In other embodiments (not shown), the router routes backwards from the target routing resource to the source of the net.

Figure 7:
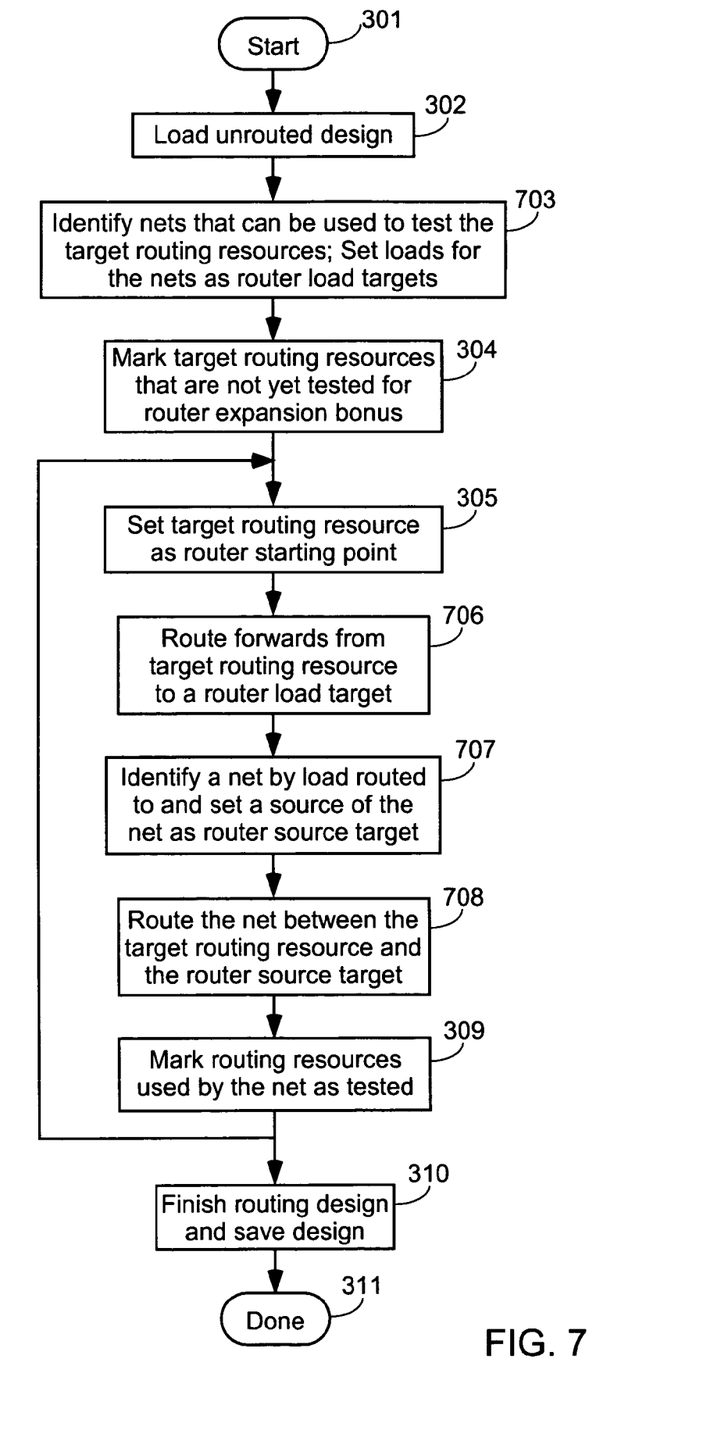
FIG. 7 illustrates the steps of a third method of generating a test design for a PLD, according to an embodiment of the present invention.

In the method of FIG. 3, the router routes from the target routing resource first to sources, then to loads. In the method of FIGS. 4–6, the "first source, then load" approach is first attempted. However, if this route fails, the router attempts to route to the loads first, and then to the sources. FIG. 7 illustrates another embodiment that utilizes the "first load, then source" approach.

The method of FIG. 7 is similar to the method of FIG. 3. Therefore, similarly numbered steps are similar to corresponding steps in FIG. 3. The following steps differ between the two figures. In step 703, after identifying the nets that can be used to test the target routing resources, the loads for the nets are set as router load targets. In step 706, the router routes forward from the target routing resource to a router load target, instead of routing backwards from a routing resource to the source as in step 306 (see FIG. 3). In step 707, the net is identified by the load routed to, and a source of the net is set as the router source target. In step 708, the router routes the net between the target routing resource and the router source target. In some embodiments, the router routes backwards from the target routing resource to the router source target. In other embodiments, the router routes forwards from the router source target to the target routing resource.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the circuits and methods of the invention in the context of field programmable gate arrays (FPGAs). However, the methods of the invention can also be implemented in other PLDs, e.g., in complex programmable logic devices (CPLDs) and other re-programmable devices.

Accordingly, all such modifications and additions are deemed to be within the scope of the invention, which is to be limited only by the appended claims and their equivalents.

What is claimed is:

1. A method of generating a test design for a reprogrammable programmable logic device (PLD), the test design utilizing target routing resources of the reprogrammable PLD targeted for testing, the method comprising:

loading an unrouted design;

identifying nets in the unrouted design that can be used to test the target routing resources in the reprogrammable PLD and setting sources of the identified nets as router source targets;

processing each target routing resource by:
setting the target routing resource as a router starting point,
routing backwards from the target routing resource to one of the router source targets,
identifying a net by the source routed to and setting a load of the net as a router load target,
routing forwards from the target routing resource to the router load target, and
marking routing resources used by the net as tested; and routing a remainder of the unrouted design to create the test design.

2. The method of claim 1, wherein the identifying nets in the unrouted design that can be used to test the target routing resources comprises identifying all nets in the unrouted design that can be used to test the target routing resources.

3. The method of claim 1, further comprising loading a list of the target routing resources, and wherein the marking the routing resources used by the net as tested comprises marking the target routing resource used by the net as tested in the list of the target routing resources.

4. The method of claim 1, further comprising repeating the loading, identifying, processing, and routing if some of the target routing resources were not successfully processed.

5. The method of claim 1, wherein for each target routing resource, routing forwards from the target routing resource to the router load target comprises:
routing forwards from the target routing resource to a first router load target; and
setting, if the routing forwards is unsuccessful, a new router load target comprising another load of the net, and routing from the target routing resource forwards to the new router load target.

6. The method of claim 1, further comprising:
marking routing resources that are not yet tested to receive a router expansion bonus.

7. The method of claim 1, wherein the routing backwards, identifying, and routing forwards are performed sequentially.

8. The method of claim 1, wherein at least two of the routing backwards, identifying, and routing forwards are performed interactively one with another.

9. A computer-readable storage medium comprising computer-executable code for generating a test design for a reprogrammable programmable logic device (PLD), the test design utilizing target routing resources of the reprogrammable PLD targeted for testing, the medium comprising:
code for loading an unrouted design;
code for identifying nets in the unrouted design that can be used to test the target routing resources in the reprogrammable PLD and for setting sources of the identified nets as router source targets;
code for processing each target routing resource, comprising:
code for setting the target routing resource as a router starting point,
code for routing backwards from the target routing resource to one of the router source targets,
code for identifying a net by the source routed to and setting a load of the net as a router load target,
code for routing forwards from the target routing resource to the router load target, and
code for marking routing resources used by the net as tested; and
code for routing a remainder of the unrouted design to create the test design.

10. The computer-readable storage medium of claim 9, wherein the code for routing backwards, the code for identifying, and the code for routing forwards act independently from each other.

11. The computer-readable storage medium of claim 9, wherein at least two of the code for routing backwards, the code for identifying, and the code for routing forwards are interactive one with another.

12. A computer system for generating a test design for a reprogrammable programmable logic device (PLD), the test design utilizing target routing resources of the reprogrammable PLD targeted for testing, the system comprising:
a design loading module for loading an unrouted design;
a net identification module for identifying nets in the unrouted design that can be used to test the target routing resources in the reprogrammable PLD and for setting sources of the identified nets as router source targets;
a resource processing module for processing each target routing resource, comprising:
a first module for setting the target routing resource as a router starting point,
a second module for routing backwards from the target routing resource to one of the router source targets,
a third module for identifying a net by the source routed to and setting a load of the net as a router load target,
a fourth module for routing forwards from the target routing resource to the router load target, and
a fifth module for marking routing resources used by the net as tested; and
a routing module for routing a remainder of the unrouted design to create the test design.

13. The computer system of claim 12, wherein the second, third, and fourth modules act independently from each other.

14. The computer system of claim 12, wherein at least two of the second, third, and fourth modules are interactive one with another.

15. A method of generating a test design for a reprogrammable programmable logic device (PLD), the test design utilizing target routing resources of the reprogrammable PLD targeted for testing, the method comprising:
loading an unrouted design;
identifying nets in the unrouted design that can be used to test the target routing resources in the reprogrammable PLD and setting loads of the identified nets as router load targets;
processing each target routing resource by:
setting the target routing resource as a router starting point,
routing forwards from the target routing resource to one of the router load targets,
identifying a net by the load routed to and setting a source of the net as a source load target,
routing the net between the target routing resource and the router source target, and
marking routing resources used by the net as tested; and
routing a remainder of the unrouted design to create the test design.

16. The method of claim 15, wherein the routing the net between the target routing resource and the router source target comprises routing the net forwards from the router source target to the target routing resource.

17. The method of claim 15, wherein the routing the net between the target routing resource and the router source target comprises routing the net backwards from the target routing resource to the router source target.

18. The method of claim 15, wherein the identifying nets in the unrouted design that can be used to test the target routing resources comprises identifying all nets in the unrouted design that can be used to test the target routing resources.

19. The method of claim 15, further comprising loading a list of the target routing resources, and wherein the marking the routing resources used by the net as tested comprises marking the target routing resource used by the net as tested in the list of the target routing resources.

20. The method of claim 15, further comprising repeating the loading, identifying, processing, and routing if some of the target routing resources were not successfully processed.

21. The method of claim 15, further comprising:
marking routing resources that are not yet tested to receive a router expansion bonus.

22. The method of claim 15, wherein the routing forwards, identifying, and routing the net are performed sequentially.

23. The method of claim 15, wherein at least two of the routing forwards, identifying, and routing the net are performed interactively one with another.

24. A computer-readable storage medium comprising computer-executable code for generating a test design for a reprogrammable programmable logic device (PLD), the test design utilizing target routing resources of the reprogrammable PLD targeted for testing, the medium comprising:
code for loading an unrouted design;
code for identifying nets in the unrouted design that can be used to test the target routing resources in the reprogrammable PLD and for setting loads of the identified nets as router load targets;
code for processing each target routing resource, comprising:
code for setting the target routing resource as a router starting point,
code for routing forwards from the target routing resource to one of the router load targets,
code for identifying a net by the load routed to and setting a source of the net as a router source target,
code for routing the net between the target routing resource and the router source target, and
code for marking routing resources used by the net as tested; and
code for routing a remainder of the unrouted design to create the test design.

25. The computer-readable storage medium of claim 24, wherein the code for routing the net between the target routing resource and the router source target comprises code for routing the net forwards from the router source target to the target routing resource.

26. The computer-readable storage medium of claim 24, wherein the code for routing the net between the target routing resource and the router source target comprises code for routing the net backwards from the target routing resource to the router source target.

27. The computer-readable storage medium of claim 24, wherein the code for routing forwards, the code for identifying, and the code for routing the net act independently from each other.

28. The computer-readable storage medium of claim 24, wherein at least two of the code for routing forwards, the code for identifying, and the code for routing the net are interactive one with another.

29. A computer system for generating a test design for a reprogrammable programmable logic device (PLD), the test design utilizing target routing resources of the reprogrammable PLD targeted for testing, the system comprising:
a design loading module for loading an unrouted design;
a net identification module for identifying nets in the unrouted design that can be used to test the target routing resources in the reprogrammable PLD and for setting loads of the identified nets as router load targets;
a resource processing module for processing each target routing resource, comprising:
a first module for setting the target routing resource as a router starting point,
a second module for routing forwards from the target routing resource to one of the router load targets,
a third module for identifying a net by the load routed to and setting a source of the net as a router source target,
a fourth module for routing the net between the target routing resource and the router source target, and
a fifth module for marking routing resources used by the net as tested; and
a routing module for routing a remainder of the unrouted design to create the test design.

30. The computer system of claim 29, wherein the fourth module routes the net forwards from the router source target to the target routing resource.

31. The computer system of claim 29, wherein the fourth module routes the net backwards from the target routing resource to the router source target.

32. The computer system of claim 29, wherein the second, third, and fourth modules act independently from each other.

33. The computer system of claim 29, wherein at least two of the second, third, and fourth modules are interactive one with another.

* * * * *